US 8,232,653 B2

Jul. 31, 2012

(12) United States Patent
Lee

(10) Patent No.: US 8,232,653 B2
(45) Date of Patent: Jul. 31, 2012

(54) WIRING STRUCTURES

(75) Inventor: Kyoung-Woo Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 12/661,866

(22) Filed: Mar. 25, 2010

(65) Prior Publication Data

US 2010/0244255 A1 Sep. 30, 2010

(30) Foreign Application Priority Data

Mar. 26, 2009 (KR) .................. 10-2009-0025748

(51) Int. Cl.
*H01L 23/52* (2006.01)
*H01L 23/48* (2006.01)
*H01L 29/40* (2006.01)

(52) U.S. Cl. .............. 257/774; 257/E21.581; 257/751; 257/758; 438/411; 438/421

(58) Field of Classification Search ........... 257/E23.157, 257/E21.251, E21.579, E21.581, 374, 501, 257/506, 510, 522, 638, 751, 758, 774; 438/411, 438/421, 422, 619
See application file for complete search history.

(56) References Cited

U.S. PATENT DOCUMENTS

| 5,408,130 A * | 4/1995 | Woo et al. ............. 257/758 |
| 6,078,088 A * | 6/2000 | Buynoski ............. 257/410 |
| 6,090,698 A * | 7/2000 | Lee ..................... 438/619 |
| 6,211,561 B1 * | 4/2001 | Zhao ..................... 257/522 |
| 6,413,852 B1 * | 7/2002 | Grill et al. ............. 438/619 |
| 6,589,861 B2 * | 7/2003 | Park et al. ............. 438/619 |
| 7,078,814 B2 * | 7/2006 | Stamper ............... 257/760 |
| 7,224,064 B2 * | 5/2007 | Yoshie ................. 257/758 |
| 7,285,474 B2 * | 10/2007 | Anderson et al. ....... 438/411 |
| 7,319,274 B2 | 1/2008 | Beyer et al. |
| 7,422,940 B2 * | 9/2008 | Schindler et al. ....... 438/238 |
| 7,449,407 B2 * | 11/2008 | Lur et al. ............... 438/619 |
| 7,534,696 B2 * | 5/2009 | Jahnes et al. .......... 438/421 |
| 7,566,656 B2 | 7/2009 | Liu et al. |
| 7,723,227 B1 * | 5/2010 | Bian ..................... 438/623 |
| 7,741,211 B2 * | 6/2010 | Jang ..................... 438/619 |
| 7,754,601 B2 * | 7/2010 | Chen et al. ............ 438/637 |
| 2002/0055243 A1 * | 5/2002 | Lee ..................... 438/586 |
| 2005/0037604 A1 * | 2/2005 | Babich et al. .......... 438/619 |
| 2006/0030128 A1 * | 2/2006 | Bu et al. ............... 438/462 |
| 2007/0178713 A1 * | 8/2007 | Jeng ..................... 438/787 |

FOREIGN PATENT DOCUMENTS

| JP | 06053206 | 2/1994 |
| JP | 2000183158 | 6/2000 |
| JP | 2008-010534 A | 1/2008 |

* cited by examiner

*Primary Examiner* — Chris Chu
(74) *Attorney, Agent, or Firm* — Onello & Mello, LLP

(57) ABSTRACT

A wiring structure includes a conductive pattern on a substrate, a first insulation layer pattern between adjacent conductive patterns and a second insulation layer pattern on the first insulation layer pattern. The first insulation layer pattern is separated from the conductive pattern by a first distance to provide a first air gap. The second insulation layer pattern is spaced apart from the conductive pattern by a second distance substantially smaller than the first distance to provide a second air gap. The wiring structure may have a reduced parasitic capacitance while simplifying processes for forming the wiring structure.

7 Claims, 9 Drawing Sheets

WIRING STRUCTURES

RELATED APPLICATIONS

This application claims priority under 35 U.S.C. §119 to Korean patent Application No. 10-2009-0025748, filed on Mar. 26, 2009, the disclosure of which is hereby incorporated by reference herein in its entirety.

BACKGROUND

1. Technical Field

Example embodiments relate to a wiring structure and a method of forming a wiring structure. More particularly, example embodiments relate to a wiring structure effective for reducing a parasitic capacitance and a method of forming the wiring structure.

2. Description of the Related Art

As semiconductor devices continue to become more highly integrated, the size of wirings, or interconnects, and the size of spacing between wirings in a semiconductor device continue to become more considerably decreased. It is preferred that the wirings in the semiconductor device have low resistance even though the wirings have greatly reduced widths; accordingly, the wirings are generally formed using metal having a low resistance, such as copper (Cu).

When low-resistance metal wirings are arranged at a small spacing, or interval, the parasitic capacitance between adjacent metal wirings can be considerably increased. To reduce the parasitic capacitance between metal wirings, an insulation layer between the wirings can be provided using a material having a low dielectric constant (i.e., low-k material). However, this approach is limited in its effectiveness with deeper device integration.

SUMMARY

Example embodiments provide a wiring structure suitable for effectively reducing parasitic capacitance.

Example embodiments provide a method of forming a wiring structure having a reduced parasitic capacitance while preventing failures of manufacturing processes.

According to one aspect of the example embodiments, there is provided a wiring structure including a conductive pattern, a first insulation layer pattern and a second insulation layer pattern. The conductive pattern may be on a substrate. The first insulation layer pattern may be between adjacent conductive patterns. The first insulation layer pattern may be separated from the conductive pattern by a first distance. A first air gap may be provided between the conductive pattern and the first insulation layer pattern. The second insulation layer pattern may be on the first insulation layer pattern. The second insulation layer pattern may be separated from the conductive pattern by a second distance substantially smaller than the first distance. A second air gap may be provided between the conductive pattern and the second insulation layer pattern.

In example embodiments, the first insulation layer pattern may comprise a material that is more readily damaged by a plasma etch process than a material of the second insulation layer pattern.

In example embodiments, each of the first and the second insulation layer patterns may comprise a material having a low dielectric constant. For example, the first and the second insulation layer patterns may include silicon hydroxyl carbon (SiCOH) having pores. Here, the first insulation layer pattern may have a pore concentration that is substantially larger than that of the second insulation layer pattern.

In example embodiments, the wiring structure may additionally comprise an insulation pattern filling the second air gap between the second insulation layer pattern and the conductive pattern.

In example embodiments, the wiring structure may further comprise an additional insulation layer on the second insulation layer pattern and the conductive pattern to fill the second air gap.

In example embodiments, the conductive pattern may comprise a barrier layer pattern and a metal layer pattern. The barrier layer pattern may comprise at least one of metal and/or metal compound, and the metal layer pattern may comprise at least one of copper (Cu), tungsten (W), titanium (Ti).

In example embodiments, the wiring structure may additionally include a capping layer pattern selectively disposed on the conductive pattern.

In example embodiments, the wiring structure may further include a third insulation layer, an insulation pattern, a spacer and an upper conductive pattern. The third insulation layer may be on the conductive pattern and the second insulation layer pattern. The third insulation layer may have an opening partially exposing the conductive pattern. The insulation pattern may fill the second air gap between the conductive pattern and the second insulation layer pattern. The spacer may be on a sidewall of the opening. The upper conductive pattern may fill the opening. The insulation pattern may close the first air gap.

According to one aspect of example embodiments, there is provided a method of forming a wiring structure. In the method of forming the wiring structure, a first insulation layer may be formed on a substrate. A second insulation layer may be formed on the first insulation layer. The first and the second insulation layers may be partially etched to form a first opening exposing the substrate. A first pattern and a second pattern may be formed on sidewalls of the first and the second insulation layers, respectively. The first pattern may have a thickness substantially larger than a thickness of the second pattern. A conductive pattern may be formed to fill the first opening. The first and the second patterns may be removed to form a first air gap between the conductive pattern and the first insulation layer and to form a second air gap between the conductive pattern and the second insulation layer.

In example embodiments, the first and the second patterns may be formed as a result of damage to the first and the second insulation layers caused by a plasma etching process. The plasma process may include a plasma ashing process for removing a photoresist pattern used to form the opening.

In example embodiments, an additional insulation layer may be formed on the conductive pattern and the second insulation layer. The additional insulation layer may close the first air gap and the second air gap. Alternatively, the additional insulation layer may fill the second air gap and may close the first air gap.

In example embodiments, a capping layer pattern may be selectively formed on the conductive pattern.

In example embodiments, an etch stop layer may be formed on the conductive pattern and the second insulation layer. A third insulation layer may be formed on the etch stop layer. A second opening may be formed through the third insulation layer and the etch stop layer. A spacer may be formed on a sidewall of the second opening. An upper conductive pattern may be formed to fill the second opening. An insulation pattern may be formed to fill the second air gap. The insulation pattern and the spacer may be simultaneously formed.

According to example embodiments, the wiring structure may have a relatively low resistance and an enhanced structural stability while ensuring a reduced parasitic capacitance. Therefore, a semiconductor device including the wiring structure may have improved electrical characteristics while increasing an integration degree thereof.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
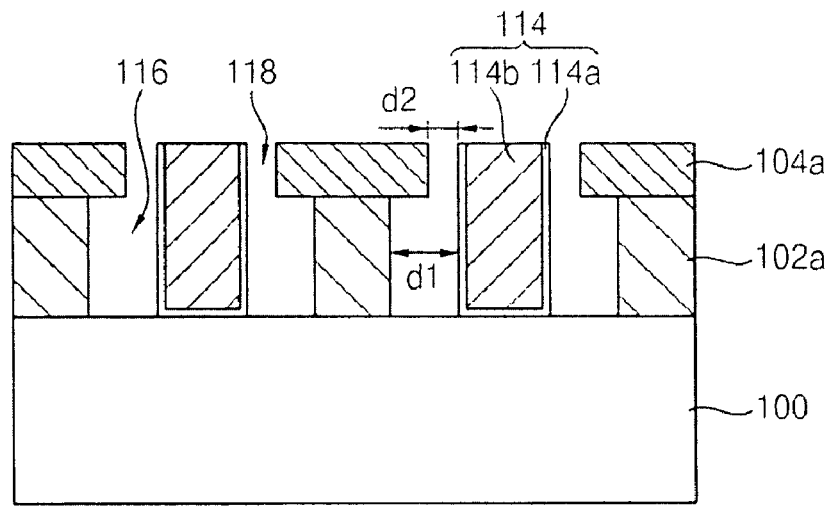
FIG. 1 is a cross-sectional view illustrating a wiring structure in accordance with example embodiments.

The example embodiments are described more fully hereinafter with reference to the accompanying drawings. The inventive concepts may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
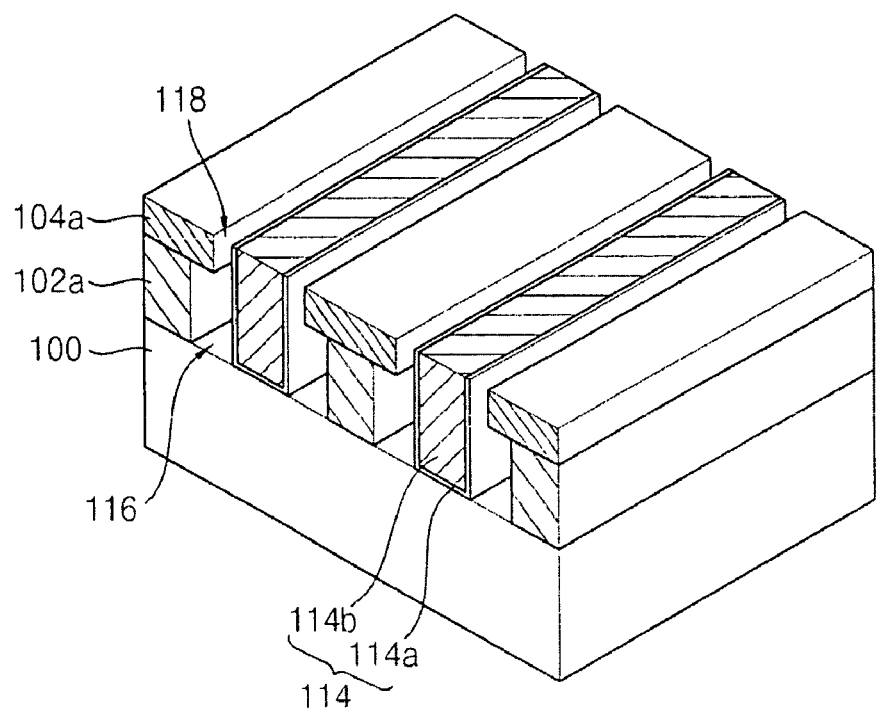
FIG. 2 is a perspective view illustrating a wiring structure in accordance with example embodiments.

FIG. 1 is a cross-sectional view illustrating a wiring structure in accordance with example embodiments. FIG. 2 is a perspective view illustrating a wiring structure in accordance with example embodiments.

Referring to FIGS. 1 and 2, conductive patterns 114 are provided on a substrate 100. The substrate 100 may comprise a semiconductor substrate or a substrate having a semiconductor layer thereon. For example, the substrate 100 may comprise a silicon substrate, a germanium substrate, a silicon-germanium substrate, a silicon-on-insulator (SOI) substrate, a germanium-on-insulator (GOI) substrate, or other suitable substrate material.

In one embodiment, the conductive patterns 114 are spaced apart from each other by a distance. As such, the conductive patterns 114 can be regularly arranged on the substrate 100 at a predetermined interval. Each of the conductive patterns 114 may have a line shape or a bar shape extending on the substrate 100 in a predetermined direction. Each conductive pattern 114 may comprise a conductive material, such as metal, having a relatively low resistance.

In example embodiments, each of the conductive patterns 114 includes a barrier layer pattern 114a and a metal layer pattern 114b. The barrier layer pattern 114a may at least partially surround the metal layer pattern 114b. For example, in one embodiment, a sidewall and a bottom of the metal layer pattern 114b make contact with the barrier layer pattern 114a. The metal layer pattern 114b may comprise copper (Cu), tungsten (W), titanium (Ti), and the like. The barrier layer pattern 114a may include metal and/or metal compound. For example, the barrier layer pattern 114a may include titanium, titanium nitride (TiNx), tantalum (Ta), tantalum nitride (TaNx), aluminum (Al), aluminum nitride (AlNx), tungsten, tungsten nitride (WNx), and the like. The barrier layer pattern 114a can comprise a single layer structure including a metal film pattern or can comprise a metal compound film pattern. Alternatively, the barrier layer pattern 114a may have a multiple layered structure that includes at least one metal film pattern and/or at least one metal compound film pattern.

In some example embodiments, an underlying structure including a switching element can be provided on the substrate 100. The switching element can include a transistor such as a metal oxide semiconductor (MOS) transistor. Additionally, an insulation layer can be disposed on the substrate 100 to cover the underlying structure. The insulation layer may include oxide, for example, silicon oxide. When the underlying structure and the insulation layer are formed on the substrate 100, the conductive patterns 114 may be disposed on the insulation layer.

A first insulation layer pattern 102a and a second insulation layer pattern 104a are sequentially formed on the substrate 100. The first and the second insulation layer patterns 102a and 104a can be disposed between adjacent conductive patterns 114. Accordingly, the conductive patterns 114 and the first and the second insulation layer patterns 102a and 104a can be alternately disposed on the substrate 100.

In example embodiments, upper surfaces of the second insulation layer pattern 104a and the conductive patterns 114 may be positioned on substantially the same plane. Namely, the conductive patterns 114 may have heights relative to a top surface of the substrate that are substantially the same as, or substantially similar to, the combined height of the first and the second insulation layer patterns 102a and 104a. Here, each of the first insulation layer patterns 102a may have a thickness in the vertical direction relative to the substrate that is substantially larger than a thickness of each second insulation layer pattern 104a.

In one embodiment, the first insulation layer pattern 102a can comprise a material that is substantially the same as, or substantially similar to, that of the second insulation layer pattern 104a. However, the first insulation layer pattern 102a may have properties that are substantially different from those of the second insulation layer pattern 104a when the process of forming the first insulation layer pattern 102a is different from the process of forming the second insulation layer pattern 104a. For example, the first and the second insulation layer patterns 102 and 104a may have different amounts of etching damages following a plasma etching process. That is, the first insulation layer pattern 102a may have an amount of etch damage that is substantially greater than that of the second insulation layer pattern 104a as a result of a plasma treatment process. In some example embodiments, the first insulation layer pattern 102a can comprise a material that is different from that of the second insulation layer patterns 104a. For example, the first insulation layer pattern 102a may include one of oxide, nitride and oxynitride whereas the second insulation layer pattern 104a may include another one of oxide, nitride and oxynitride.

Each of the first and the second insulation layer patterns 102a and 104a may include a material having a relatively low dielectric constant. For example, each of the first and the second insulation layer patterns 102a and 104a may include a material containing silicon hydroxyl carbon (SiCOH). Generally, a layer including such a material containing SiCOH may be easily damaged during a plasma treatment process. As the content of carbon in the layer including SiCOH increases, pores in the layer including SiCOH may also increase. During the plasma treatment process, a layer of SiCOH including many pores may undergo damage to a greater extent than that of a layer of SiCOH having few pores. Thus, the extent of damage to a portion of the layer of SiCOH including many pores may be substantially greater than the extent of damage to a portion of the layer of SiCOH including few pores as a result of the plasma treatment process.

In example embodiments, the first insulation layer pattern 102a may have a number of pores per unit volume that is substantially greater than that of the second insulation layer pattern 104a. That is, the first insulation layer pattern 102a may have a carbon content that is substantially larger than that of the second insulation layer pattern 104a.

Each of the first and the second insulation layer patterns 102a and 104a can be constructed so an to not make contact with sidewalls of the conductive patterns 114. Namely, the first and the second insulation layer patterns 102a and 104a may be spaced apart in a horizontal direction relative to the substrate from adjacent conductive patterns 114. The first insulation layer patterns 102a may be spaced apart from the conductive pattern 114 by a first distance (d1) and the second insulation layer pattern 104a may be separated from the conductive pattern 114 by a second distance (d2). Here, the second distance (d2) may be substantially less than the first distance (d1). In other words, in some embodiments, the second insulation layer pattern 104a can protrude, in a horizontal direction, from the first insulation layer pattern 102a.

A first air gap 116 is present between the first insulation layer pattern 102a and the conductive pattern 114. Further, a second air gap 118 is present between the second insulation layer pattern 104a and the conductive pattern 114. Each of the first and the second air gaps 116 and 118 may have a very low dielectric constant, and the parasitic capacitance between adjacent conductive patterns 114 may also be considerably reduced.

According to example embodiments, the first distance (d1) may be substantially larger than the second distance (d2), so that additional upper structures can be provided on the wiring structure including the second insulation layer pattern 104a, while still maintaining the first and the second air gaps 116 and 118. Additionally, the second insulation layer pattern 104a is separated from the conductive pattern 114 by the second distance (d2) that is substantially smaller than the first distance (d1). When the second insulation layer pattern 104a has a thickness (height) substantially smaller than a thickness (height) of the first insulation layer pattern 102a, the parasitic capacitance between adjacent conductive patterns 114 can be further reduced.

FIGS. 3 to 7 are cross-sectional views illustrating a method of forming a wiring structure in accordance with example embodiments.

Figure 3:
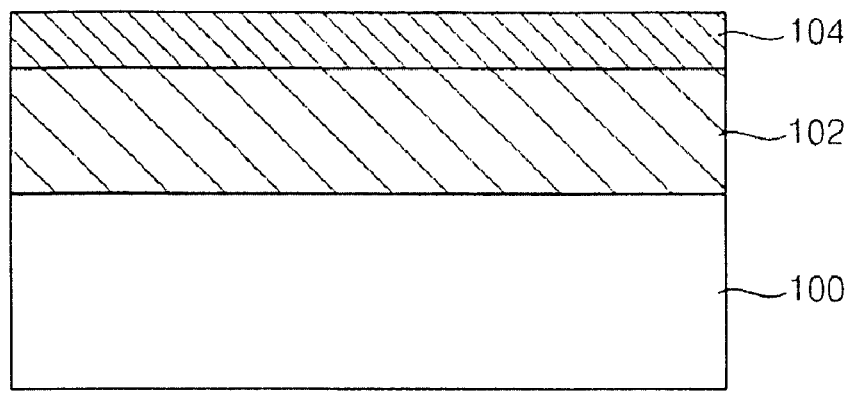
FIGS. 3 to 7 are cross-sectional views illustrating a method of forming a wiring structure in accordance with example embodiments.

Referring to FIG. 3, a first insulation layer 102 is formed on a substrate 100. The substrate 100 may include a semiconductor substrate or a substrate having a semiconductor layer positioned thereon. The first insulation layer 102 may be formed using a first material having a relatively low dielectric constant, so that the first insulation layer 102 may be readily damaged in a plasma treatment process. For example, the first insulation layer 102 can include silicon hydroxyl carbon (Si-COH).

A second insulation layer 104 is formed on the first insulation layer 102. The second insulation layer 104 may be formed using a second material, such that the second insulation layer 104 undergoes substantially less damage than that of the first insulation layer 102 during the plasma treatment process. For example, the second insulation layer 104 may be formed using SiCOH having content of carbon and hydrogen that is substantially less than that of the first insulation layer 102. The second insulation layer 104 may have a thickness substantially less than that of the first insulation layer 102.

In some example embodiments, the first and the second insulation layers 102 and 104 may be formed in-situ using one apparatus. However, in alternative embodiments, the first and the second insulation layers 102 and 104 may be formed under different process conditions so that they have different characteristics. For example, the first and the second insulation layers 102 and 104 can be obtained under a selection of process conditions such as flow rates of reaction gases, deposition temperatures, pressures in a process chamber, etc.

Figure 4:
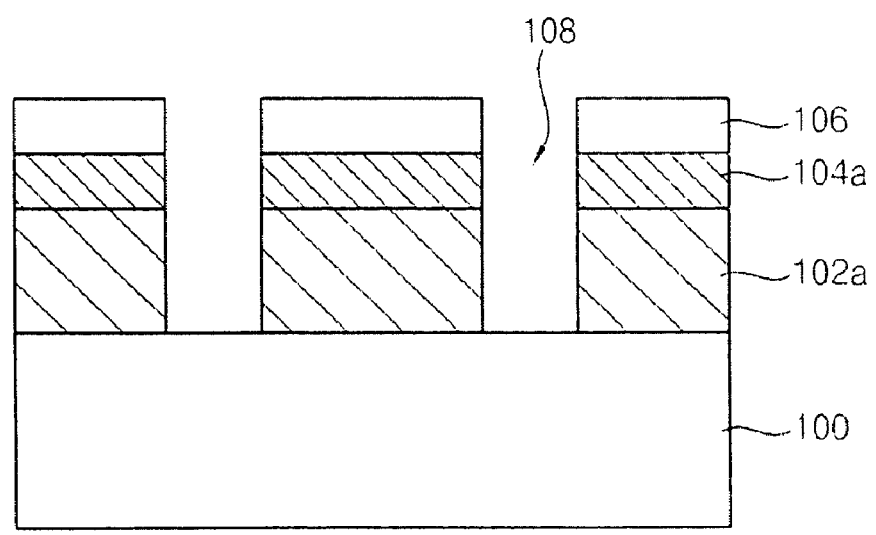

Referring to FIG. 4, a photoresist film (not illustrated) is coated on the second insulation layer 104. The photoresist film is exposed and developed to form a photoresist pattern 106 on the second insulation layer 104. The photoresist pattern 106 may selectively expose portions of the second insulation layer 104 where conductive patterns 114 (see FIG. 6) will be formed in subsequent processes.

The second insulation layer 104 and the first insulation layer 102 are partially etched using the photoresist pattern 106 as an etching mask. Thus, a first insulation layer pattern 102a and a second insulation layer pattern 104a are formed on the substrate 100. Openings 108 are formed through the first and the second insulation layer patterns 102a and 104a. In example embodiments, the openings 108 may have shapes substantially the same as or substantially similar to those of the conductive patterns 114. For example, each opening 108 may have a trench shape. However, the shapes of the openings 108 may vary in accordance with those of the conductive patterns 114. Further, each of the openings 108 may extend in a predetermined direction.

Figure 5:
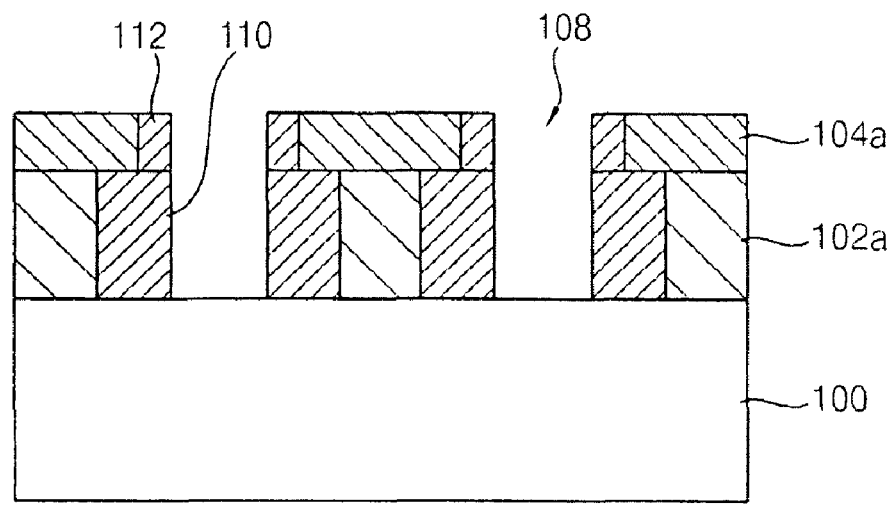

Referring to FIG. 5, the photoresist pattern 106 is removed from the second insulation layer pattern 104a by a plasma ashing process. In the plasma ashing process, an oxygen gas and/or a gas including oxygen may be used as an ashing gas for removing the photoresist pattern 106. For example, the plasma ashing process may employ a carbon oxide ($CO_2$) gas or an oxygen ($O_2$) gas as the ashing gas. In some example embodiments, the ashing gas may further include an inactive gas, for example, a nitrogen ($N_2$) gas.

In the plasma ashing process for removing the photoresist pattern 106, surfaces of the first and the second insulation layer patterns 102a and 104a exposed by the openings 108 may be damaged by plasma. For example, the surfaces of the first and the second insulation layer patterns 102a and 104a may be oxidized in the plasma ashing process, so that carbon in the surfaces of the first and the second insulation layer patterns 102a and 104a may be partially removed. Thus, the surfaces of the first and the second insulation layer patterns 102a and 104a may have a reduced content of carbon. That is, patterns may be formed at the surfaces of the first and the second insulation layer patterns 102a and 104a. The patterns may have contents of carbon substantially smaller than those of the first and the second insulation layer patterns 102a and 104a because the plasma ashing process partially removes carbon included in the patterns corresponding to the surfaces of the first and the second insulation layer patterns 102a and 104a exposed to plasma.

As illustrated in FIG. 5, a first pattern 110 and a second pattern 112 are formed on sidewalls of the first insulation layer pattern 102a and the second insulation layer pattern 104a, respectively. The resulting first and the second patterns 110 may have a carbon content that is substantially less than that of the first and the second insulation layer patterns 102a and 104b because the surfaces of the first and the second insulation layer patterns 102a and 104a may have reduced carbon content as a result of the plasma ashing process. Since the damage to the first insulation layer pattern 102a caused by plasma can be substantially lager than the damage to the second insulation layer pattern 104a caused by plasma, the first pattern 110 may have a thickness in the horizontal direction that is substantially larger than a thickness of the second pattern 112 in the horizontal direction. Hence, the first and the second patterns 110 and 112 may compose the sidewall of the opening 108. Meanwhile, the first pattern 110 may have wet etching characteristics that are substantially the same as, or substantially similar to, wet etching characteristics of the second pattern 112 because the first pattern 110 includes materials that are substantially the same as, or substantially similar to, those of the second pattern 112, for the purpose of wet etching.

In the plasma ashing process according to example embodiments, the photoresist pattern 106 is removed from the second insulation layer pattern 104a and also the first and the second patterns 110 and 112, which have thicknesses different each other, are formed at the sidewalls of the first and the second insulation layer patterns 102a and 104a. The first and the second patterns 110 and 112 may serve as sacrificial patterns for forming a first air gap 116 (see FIG. 7) and a second air gap 118 (see FIG. 7) in successive processes.

Figure 6:
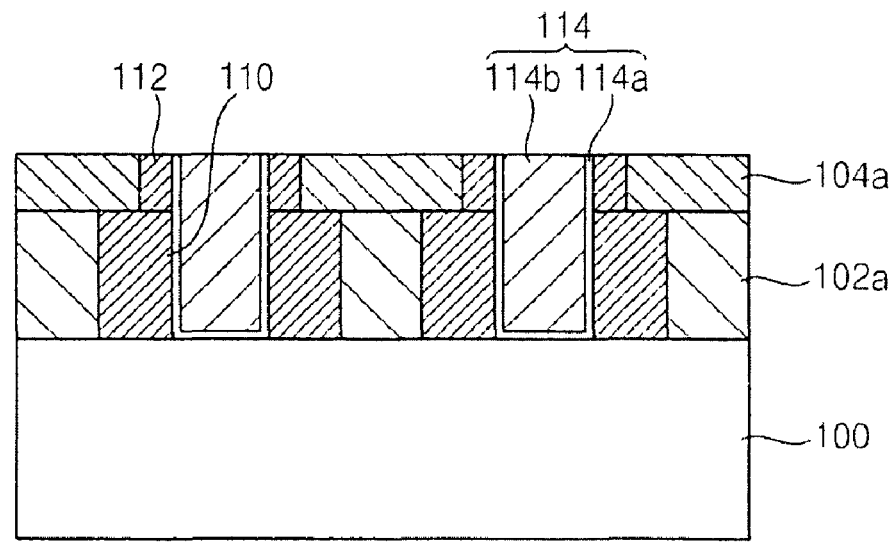

Referring to FIG. 6, a conductive layer (not illustrated) is formed on the second insulation layer pattern 104a, the second pattern 112 and the substrate 100 to fill the openings 108. In example embodiments, a barrier layer (not illustrated) is formed on the second insulation layer pattern 104a, the second pattern 112 and the substrate 100 to partially fill the openings 108, and then a metal layer (not illustrated) is formed on the barrier layer to fully fill the openings 108. The barrier layer may be conformally formed along profiles of the openings 108. The conductive layer including the barrier layer and the metal layer is partially removed until the second insulation layer pattern 104a and the second pattern 112 are exposed. Thus, the conductive patterns 114 are formed in the openings 108, respectively. Each of the conductive patterns 114 includes a barrier layer pattern 114a and a metal layer pattern 114b. The conductive patterns 114 may be obtained by a chemical mechanical polishing (CMP) process and/or an etch-back process. Each conductive pattern 114 may have a line shape or a bar shape.

The barrier layer pattern 114a may prevent metal ions and/or metal atoms in the metal layer pattern 114b from being diffused downwardly and/or horizontally. The barrier layer pattern 114a may include titanium, titanium nitride, tantalum, tantalum nitride, aluminum, aluminum nitride, tungsten, tungsten nitride, etc. These may be used alone or in a mixture thereof. The metal layer pattern 114b may include copper, tungsten, titanium, etc. The barrier layer pattern 114a may be formed by a chemical vapor deposition (CVD) process, a sputtering process, an atomic layer deposition (ALD) process, etc. The metal layer pattern 114b may be formed by an electro-chemical plating process, an electro-plating process, an electroless plating process, etc.

Figure 7:
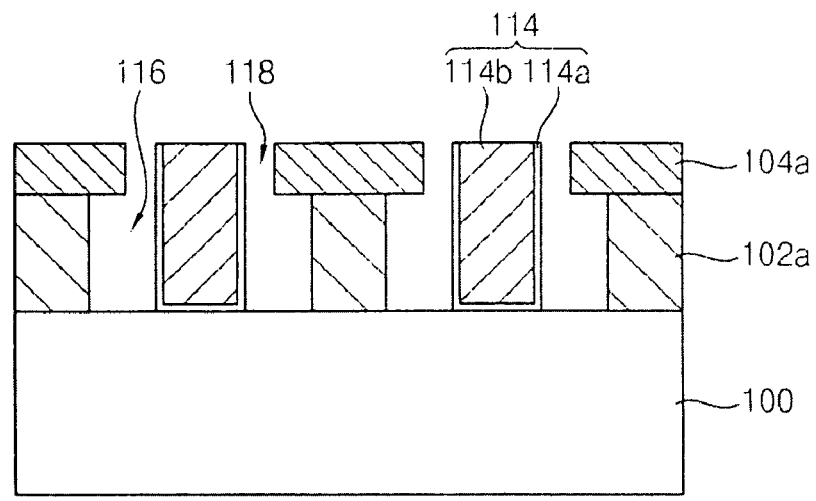

Referring to FIG. 7, the second pattern 112 and the first pattern 110 are selectively removed from the second and the first insulation layer patterns 104a and 102a. The first and the second patterns 110 and 112 can be removed by a wet etching process. While removing the first and the patterns 110 and 112, the first and the second insulation layer patterns 102a and 104a are not etched. For example, the first and the second patterns 110 and 112 may be removed using an etchant including a diluted hydrogen fluoride (HF) solution.

After removing the first and the second patterns 110 and 112, spaces are provided at positions where the first and the second patterns 110 and 112 were located. These spaces may be the first air gap 116 and the second air gap 112. That is, the first and the second patterns 110 and 112 are replaced by the first and the second air gaps 116 and 118. The first air gap 116 is positioned between the conductive pattern 114 and the first insulation layer pattern 102a and the second air gap 118 is positioned between the conductive pattern 114 and the second insulation layer pattern 104a. The first air gap 116 may have a first width substantially the same as or substantially similar to a width of the first pattern 110. The second air gap 112 may also have a second width substantially the same as or substantially similar to a width of the second pattern 112.

According to example embodiments, the first and the second patterns 110 and 112 are removed to provide the first and the second air gaps 116 and 118 among the conductive pattern 114, the first insulation layer pattern 102a and the second insulation layer pattern 104a. Since the first and the second patterns 110 and 112 serving as the sacrificial patterns for the first and the second air gaps 116 and 118 are formed by the plasma ashing process for removing the photoresist pattern 106, an additional process for forming the first and the second patterns 110 and 112 is not required. Therefore, the wiring structure including the air gaps 116 and 118 may be obtained by simplified processes without the need for additional processes for forming the air gaps 116 and 118.

Figure 8:
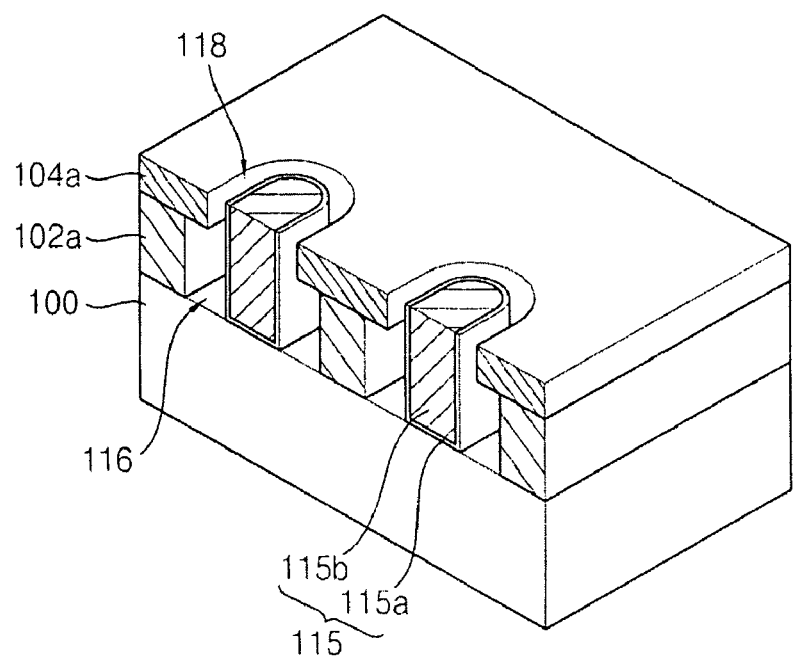
FIG. 8 is a perspective view illustrating a wiring structure in accordance with example embodiments.

FIG. 8 is a perspective view illustrating a wiring structure in accordance with example embodiments. The wiring structure illustrated in FIG. 8 may have a construction that is substantially the same as or substantially similar to that of the wiring structure described with reference to FIGS. 1 and 2, except for the presence of the conductive patterns 115. In the embodiment of FIG. 8, the conductive patterns 115 can have contact shapes or plug shapes. Further, each conductive pattern 115 may have a circular-shaped pillar structure, an elliptical-shaped pillar structure, a polygonal-shaped pillar structure, etc. Each of the conductive patterns 115 includes a barrier layer pattern 115a and a metal layer pattern 115b.

Referring to FIG. 8, a first insulation layer pattern 102a and a second insulation layer pattern 104a are disposed on portions of a substrate 100 between adjacent conductive patterns 115. Each of the first and the second insulation layer patterns 102a and 104a are separated from the adjacent conductive patterns 115. In example embodiments, the first and the second insulation layer patterns 102a and 104a may enclose the conductive patterns 115 and may be separated from the conductive patterns by predetermined distances.

A first air gap 116 is provided between the first insulation layer pattern 102a and the conductive pattern 115. The first air gap 116 is spaced apart from the conductive pattern 115 by a first distance. A second air gap 118 is provided between the second insulation layer pattern 104a and the conductive pattern 115. The second air gap 118 is also separated from the conductive pattern 115 by a second distance substantially smaller than the first distance.

The wiring structure illustrated in FIG. 8 may be obtained by processes substantially the same as or substantially similar to the processes described with reference to FIGS. 3 to 7, except for the step of forming openings through the first and the second insulation layer patterns 102a and 104a. In example embodiments, a first insulation layer and a second insulation layer may be partially etched to form the first and the second insulation layer patterns 102a and 104a while forming the openings having contact hole shapes or plug shapes through the first and the second insulation layer patterns 102a and 104a. Each of the openings may have a shape substantially the same as or substantially similar to that of each conductive patterns 115. Therefore, the conductive patterns 115 may have contact shapes or the plug shapes in accordance with those of the openings.

Figure 9:
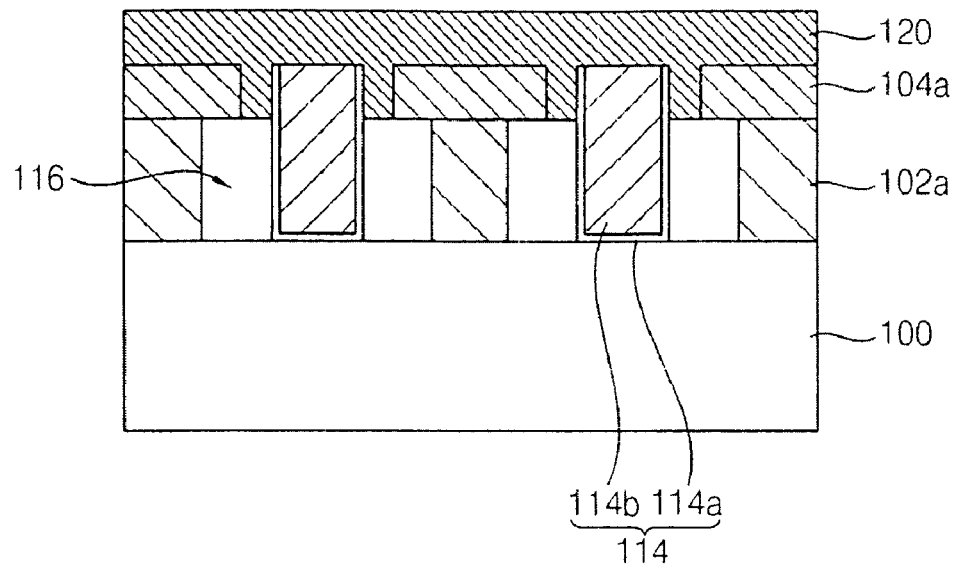
FIG. 9 is a cross-sectional view illustrating a wiring structure in accordance with example embodiments.

FIG. 9 is a cross-sectional view illustrating a wiring structure in accordance with example embodiments.

Referring to FIG. 9, a wiring structure may have a construction substantially the same as or substantially similar to that of the wiring structure described with reference to FIGS. 1 and 2 except that the wiring structure in FIG. 9 additionally includes an insulation layer 120.

The wiring structure illustrated in FIG. 9 includes conductive patterns 114, a first insulation layer pattern 102a, a second insulation layer pattern 104a and the insulation layer 120. A first air gap 116 is provided between the conductive pattern 114 and the first insulation layer pattern 102a.

A distance between the conductive pattern 114 and the second insulation layer pattern 104 may be substantially smaller than a distance (i.e., a width of the first air gap 116) between the conductive pattern 114 and the first insulation layer pattern 104a.

A portion of the insulation layer 120 fills a space between the conductive pattern 114 and the second insulation layer pattern 104a. For example, a lower portion of the insulation layer 120 may be interposed between the second insulation layer pattern 104a and the conductive pattern 114. The insulation layer 120 covers the second insulation layer pattern 104a and an upper portion of the conductive pattern 114. The insulation layer 120 can prevent metal atoms and/or metal ions present in the conductive pattern 114 from being diffused toward an upper element of the structure. When the electromigration phenomenon caused by the diffusion of the metal atoms and/or the metal ions generates from the conductive pattern 114, an electrical short can occur in the conductive pattern 114. Since the insulation layer 120 covers the upper portion of the conductive pattern 114, the conductive pattern 114 may ensure improved electrical characteristics.

As illustrated in FIG. 9, a lower surface of the portion of the insulation layer 120 filling the space between the conductive pattern 114 and the second insulation layer pattern 104a may be positioned at a location which is higher than, relative to the substrate, an upper surface of the first insulation layer pattern 102a. That is, in this example, portions of the insulation layer 120 are not formed in the first air gap 116. The insulation layer 120 can cover the upper portion of the first air gap 116, and the first air gap 116, thereby covered by the insulation layer 120, can be filled with air.

In example embodiments, the insulation layer 120 may include nitride, carbide, carbon nitride, etc. For example, the insulation layer 120 may include silicon nitride (SiNx), silicon carbide (SiCx), silicon carbon nitride (SiCxNy), etc. The insulation layer 120 can have a single layer structure that includes a silicon nitride film, a silicon carbide film, a silicon carbon nitride film, etc. Alternatively, the insulation layer 120 may have a multiple-layered structure including at least one of silicon nitride film, at least one silicon carbide film and/or at least one silicon carbon nitride film.

In the wiring structure illustrated in FIG. 9, the wiring structure has the first air gap 116 generated between the conductive pattern 114 and the first insulation layer pattern 102a. Additionally, the insulation layer 120 covering the conductive pattern 114 and the second insulation layer pattern 104a can partially, substantially, or completely, fill the space between the conductive pattern 114 and the second insulation layer pattern 104a. Since the first air gap 116 is closed by the insulation layer 120, the wiring structure can have improved structural stability. Furthermore, the electrical failure of the conductive pattern 114 caused by metal migration may be effectively prevented, as a result of the presence of the insulation layer 120.

In a method of manufacturing the wiring structure illustrated in FIG. 9 a deposition process of forming the insulation layer 120 may be additionally performed after forming the wiring structure described with reference to FIGS. 1 and 2. For example, after performing the processes described with reference to FIGS. 3 to 7, the insulation layer 120 may be formed on the conductive pattern 114 and the second insulation layer pattern 104a to fill a second air gap between the conductive pattern 114 and the second insulation layer pattern 104a. The insulation layer 120 may be formed using SiNx, SiCx, SiCxNy, and other applicable insulating materials. The insulation layer 120 may have a single-layer structure or a multiple-layer structure.

To fill the second air gap having a narrow width with the insulation layer 120, the insulation layer 120 may be formed by an atomic layer deposition (ALD) process. Since the ALD process may provide a very thin film, the insulation layer 120 can readily fill the narrow second air gap between the conductive pattern 114 and the second insulation layer pattern 104a when the insulation layer 120 is formed by the ALD process.

Figure 10:
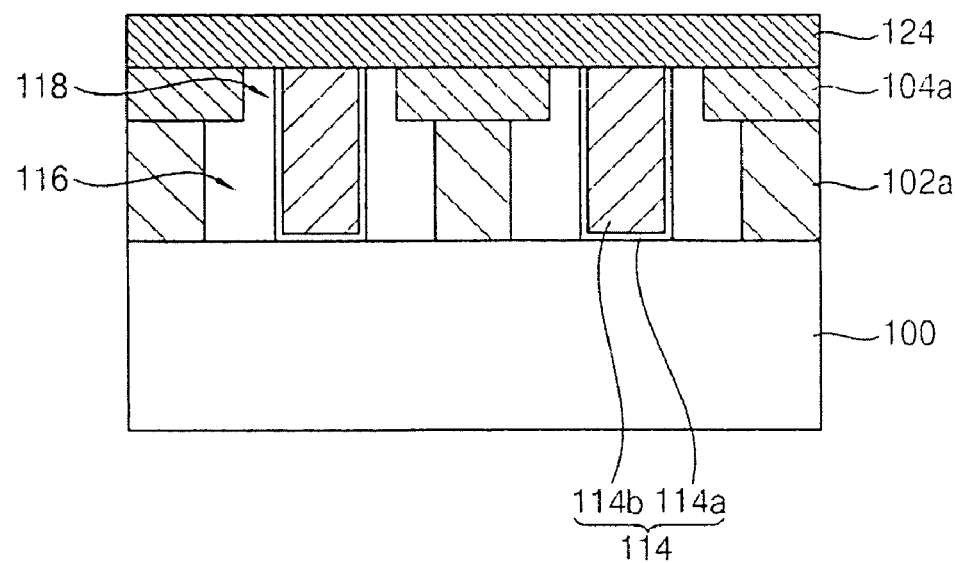
FIG. 10 is a cross-sectional view illustrating a wiring structure in accordance with example embodiments.

FIG. 10 is a cross-sectional view illustrating a wiring structure in accordance with example embodiments.

In FIG. 10, a wiring structure may have a construction substantially the same as or substantially similar to that of the wiring structure illustrated in FIGS. 1 and 2 except for the presence of an insulation layer 124.

Referring to FIG. 10, the insulation layer 124 is provided on a second insulation layer pattern 104a in close proximity to a second air gap 118 between the second insulation layer pattern 104a and the conductive pattern 114. In this example, the insulation layer 124 is not positioned in the first air gap 116 and the second air gap 118, or is only minimally positioned in the second air gap 118. That is, the insulation layer 120 may operate to close the first and the second air gaps 116 and 118 while trapping air in the first and the second air gaps 116 and 118.

The wiring structure illustrated in FIG. 10 may have a more reduced parasitic capacitance, relative to the embodiment of FIG. 9, because the first and the second air gaps 116 and 118 are filled with air.

Figure 11:
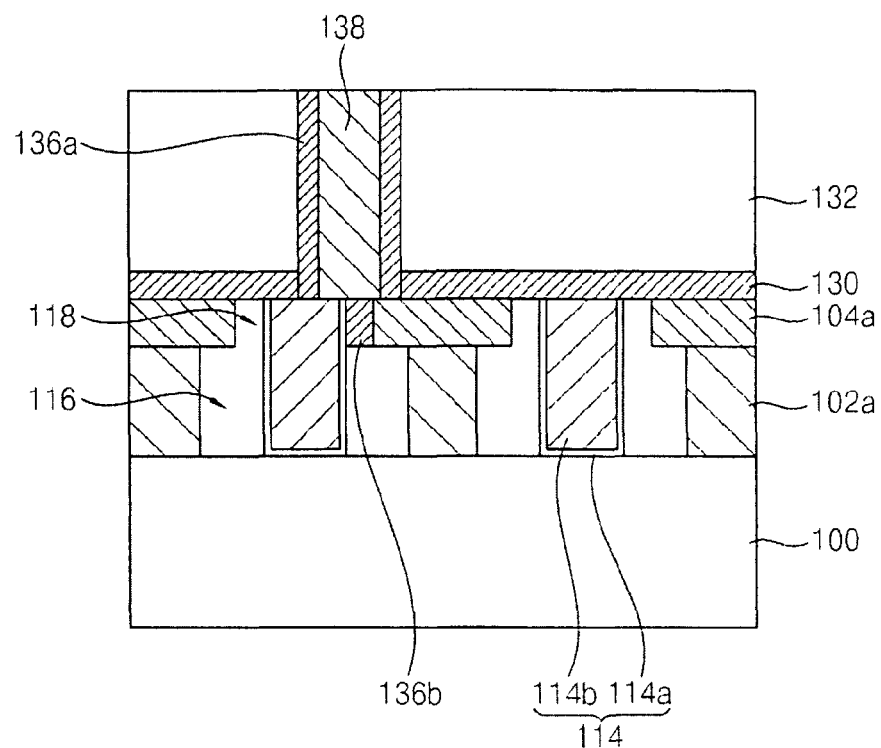
FIG. 11 is a cross-sectional view illustrating a wiring structure in accordance with example embodiments.

FIG. 11 is a cross-sectional view illustrating a wiring structure in accordance with example embodiments. The wiring structure in FIG. 11 may have a construction that is substantially the same as, or substantially similar to, that of the wiring structure described with reference to FIGS. 1 and 2 except for the presence of a spacer 136a, an insulation pattern 136b and an upper conductive pattern 138.

Referring to FIG. 11, an etch stop layer 130 is disposed on a second insulation layer pattern 104a and a conductive pattern 114. The etch stop layer 130 operates to close a first air gap 116 and a second air gap 118. In one embodiment, the etch stop layer 130 may include a material containing nitride, for example, silicon nitride (SiNx), silicon carbon nitride (SiCxNy), etc. The etch stop layer 130 may serve as an insulation barrier layer for preventing metal atoms and/or metal ions included in the conductive pattern 114 from being diffused toward an upper structure.

A third insulation layer 132 is positioned on the etch stop layer 130. A second opening is formed through the third insulation layer 132 and the etch stop layer 130. The second opening partially exposes a conductive pattern 114 located beneath the etch stop layer 130.

The third insulation layer 132 may include oxide such as silicon oxide. Here, the third insulation layer 132 may include a material different from those of the first and the second insulation layer patterns 102 and 104a. For example, the third insulation layer 132 may include silicon oxide without carbon and hydrogen.

In example embodiments, one second air gap 118 at either side of, and contacting, the second opening may be filled with the insulation pattern 136b. The insulation pattern 136b may include nitride, for example, silicon nitride. The insulation pattern 136b may make contact with the conductive pattern 114 and the second insulation layer pattern 104a. Other second air gaps 118 away from the second opening may be filled with air. The first air gaps 116 may also be filled with air. Thus, the insulation pattern 136b may close the first air gap 116. Further, the insulation pattern 136b may be exposed by the second opening.

The spacer 136a is disposed on a sidewall of the second opening 134. In one embodiment, the spacer 136a may include nitride such as silicon nitride. The spacer 136a may comprise a material substantially the same as, or substantially similar to that of, the insulation pattern 136b filling the second air gap 118.

The upper conductive pattern 138 is positioned on the spacer 136a to fill the second opening. The upper conductive pattern 138 can contact the conductive pattern 114 and the insulation pattern 136b. The upper conductive pattern 138 may include metal and/or metal compound. For example, the upper conductive pattern 138 may include copper, titanium, tungsten, tantalum, aluminum, titanium nitride, tungsten nitride, tantalum nitride, and other suitable conductive materials. These may be used alone or in a mixture thereof. In example embodiments, the conductive pattern 138 may include metal substantially the same as or substantially similar to that of the conductive pattern 114. Alternatively, the upper conductive pattern 138 may include a conductive material different from that of the conductive pattern 114.

According to example embodiments, the wiring structure has the insulation pattern 136b filling the second air gap 118 disposed beneath the second opening 134. Hence, the wiring structure may have a more-improved structural stability. Further, the wiring structure includes the upper conductive pattern 138 contacting the conductive pattern 114 and the insulation pattern 136b separating the upper conductive pattern 138 from the first air gap 116. Therefore, the wiring structure may ensure enhanced electrical characteristics while reducing parasitic capacitance.

FIGS. 12 to 15 are cross-sectional views illustrating a method of forming a wiring structure in accordance with example embodiments.

In the method illustrated in FIGS. 12 to 15, processes of forming a first insulation layer pattern 102a, a second insulation layer pattern 104a, a conductive pattern 114 having a barrier layer pattern 114a and a metal layer pattern 114b, a first air gap 116 and a second air gap 118 may be substantially the same as or substantially similar to the processes described with reference to FIGS. 3 to 7.

Figure 12:
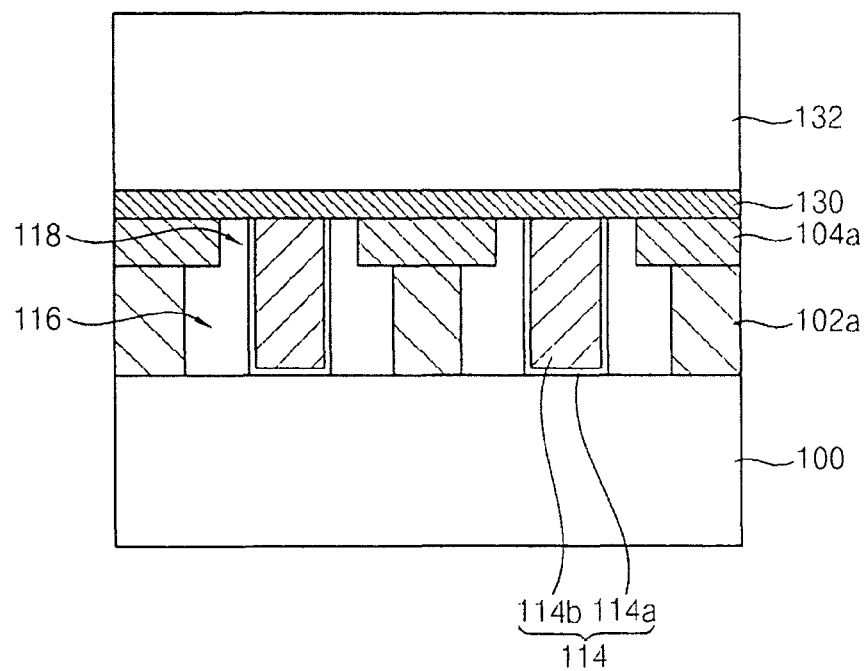
FIGS. 12 to 15 are cross-sectional views illustrating a method of forming a wiring structure in accordance with example embodiments.

Referring to FIG. 12, an etch stop layer 130 is formed on the second insulation layer pattern 104a and the conductive pattern 114. The etch stop layer 130 may close the second air gap 118 without filling the second air gap 118. The second air gap 118 may have a width that is substantially smaller than a width of the first air gap 116, so that the etch stop layer 130 may be formed by a process ensuring poor step coverage such as physical vapor deposition (PVD) process or a normal CVD process. The etch stop layer 130 may be formed using SiNx, SiCxNy, and other suitable etch stop materials. The etch stop layer 130 may have a single layer structure or a multi layer structure.

A third insulation layer 132 is formed on the etch stop layer 130. The third insulation layer 132 may be formed using silicon oxide by a CVD process. Here, the third insulation layer 132 may not have a relatively low dielectric constant whereas the first and the second insulation layer patterns 102a and 104a have relatively low dielectric constants.

Figure 13:
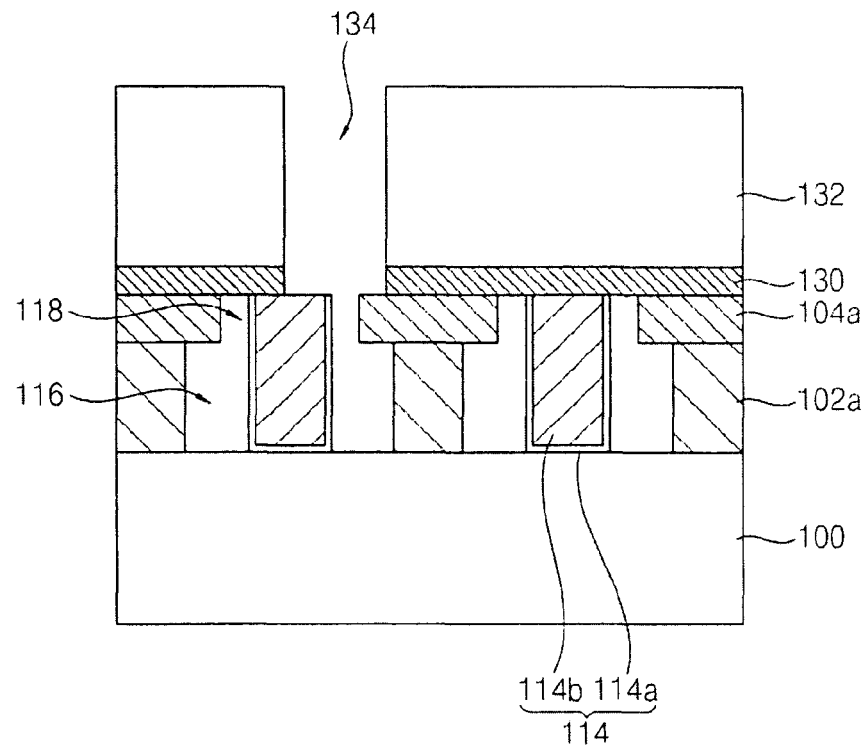

Referring to FIG. 13, a photoresist film (not illustrated) is formed on the third insulation layer 132. The photoresist film may be exposed and developed to form a photoresist pattern (not illustrated) on the third insulation layer 132. The photoresist pattern may expose a portion of the third insulation layer 132 under which a portion of the conductive patterns 114 is located.

The third insulation layer 132 is partially etched using the photoresist pattern as an etching mask until the etch stop layer 130 is exposed. The etch stop layer 130 is partially etched to form a second opening 134 partially exposing the conductive pattern 114 and the second insulation layer pattern 104a. The second opening 134 may be formed through the third insulation layer 132 and the etch stop layer 130. The second opening 134 can communicate with the second air gap 118 between the conductive pattern 114 and the second insulation layer pattern 104a. Thus, the second opening 134, the second air gap 118 and the first air gap 116 may be in communication with one another. As illustrated in FIG. 13, other second air gaps 118 separated from the second opening 134 may remain closed by the etch stop layer 130.

Figure 14:
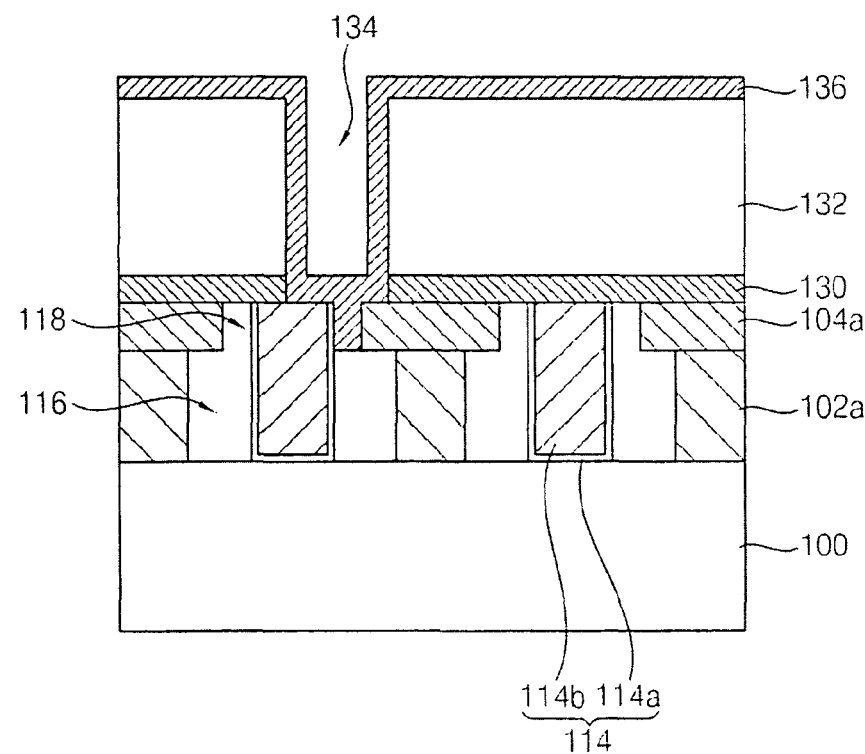

Referring to FIG. 14, an additional insulation layer 136 is formed along profiles of the third insulation layer 132, the conductive pattern 114, the second opening 134 and the second air gap 118 connected to the second opening 134. The additional insulation layer 136 may be formed using nitride, for example, silicon nitride. The additional insulation layer 136 may fill the second air gap 118 having a narrow width. Thus, the additional insulation layer 136 may be formed by an ALD process to ensure good step coverage of the additional insulation layer 136.

Figure 15:
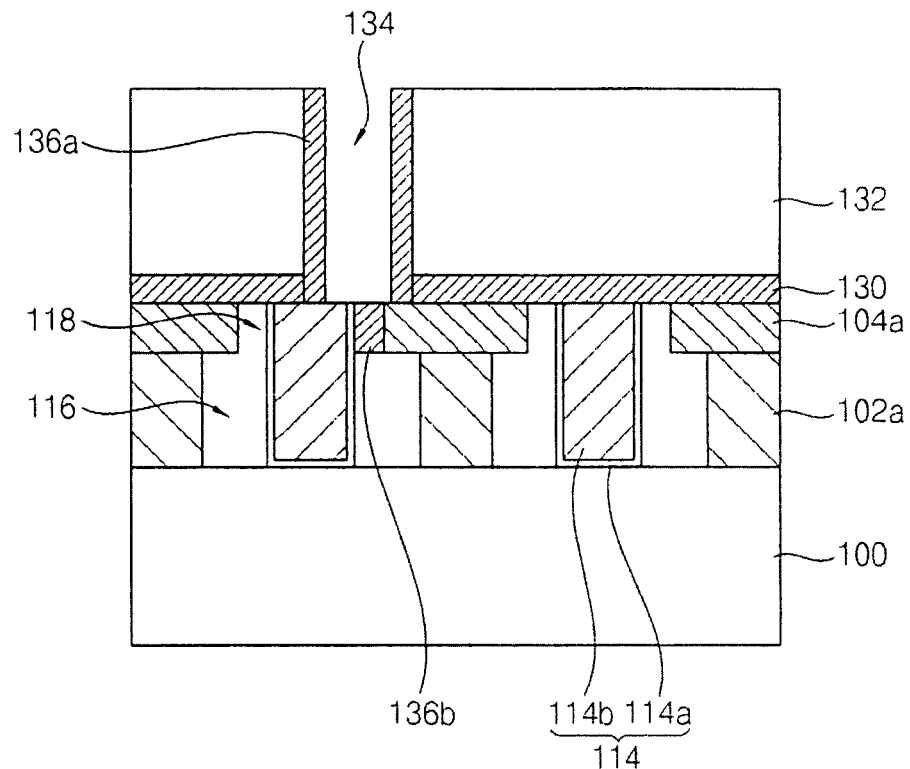

Referring to FIG. 15, the additional insulation layer 136 is partially etched to form a spacer 136a on a sidewall of the second opening 134 and to form an insulation pattern 136b in the second air gap 118. That is, a portion of the additional insulation layer 136 remains in the second air gap 118 while forming the spacer 136a. The remaining portion of the additional insulation layer 136 is the insulation pattern 136b filling the second air gap 118. The insulation pattern 136b makes contact with sidewalls of the conductive pattern 114 and the second insulation layer pattern 104a. Thus, the first air gap 116 is closed by the insulation pattern 136b. As a result, the sidewalls of the conductive pattern 114 and the second insulation layer pattern 104a may be effectively prevented from being damaged while etching the additional insulation layer 136.

Referring now to FIG. 11, a conductive layer (not illustrated) is formed on the third insulation layer 132 to fill the second opening 134. The conductive layer is partially removed until the third insulation layer 132 is exposed. Hence, an upper conductive pattern 138 is formed in the second opening 134. The upper conductive pattern 138 may be electrically connected to the conductive pattern 114. Since the second air gap 118 beneath the second opening 134 is filled with the insulation pattern 136b, the upper conductive pattern 138 may be effectively spaced apart from the first air gap 116.

Figure 16:
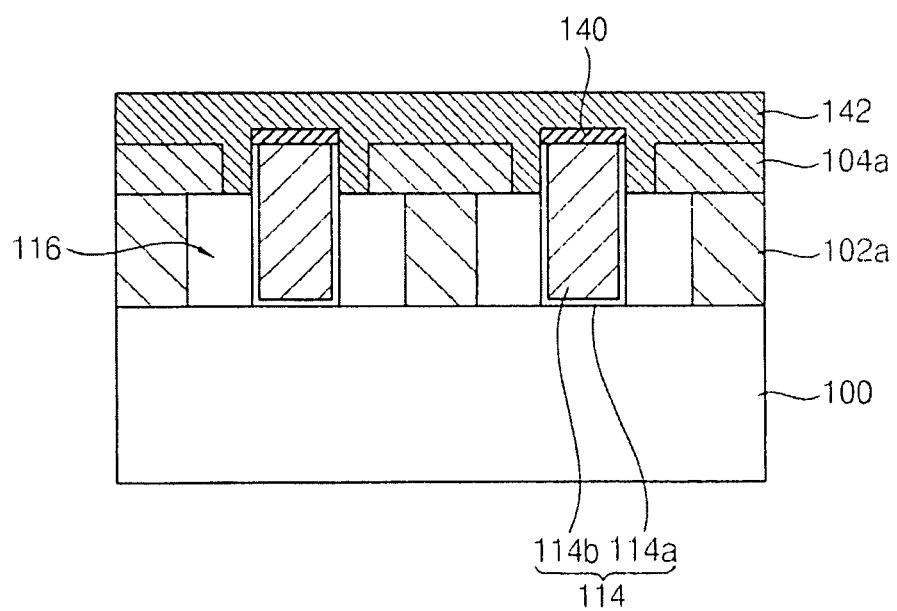
FIG. 16 is a cross-sectional view illustrating a wiring structure in accordance with example embodiments.

FIG. 16 is a cross-sectional view illustrating a wiring structure in accordance with example embodiments. The wiring structure in FIG. 16 may have a construction substantially the same as, or substantially similar to that of, the wiring structure illustrated in FIGS. 1 and 2 except for the presence of a capping layer pattern 140 and an additional insulation layer 142.

Referring to FIG. 16, the capping layer pattern 140 is disposed on a conductive pattern 114 having a barrier layer pattern 114a and a metal layer pattern 114b. The capping layer pattern 140 may prevent metal atoms and/or metal ions in the conductive pattern 114 from being diffused toward an upper structure. Further, the capping layer pattern 140 may protect the conductive pattern 114 from damage during successive processes. The capping layer pattern 140 may include metal and/or metal compound. For example, the capping layer pattern 140 may include tantalum, tantalum nitride, cobalt (Co), cobalt silicide (CoSix), an alloy of copper-tungsten-phosphorus, an alloy of copper-phosphorus-ruthenium, and other suitable capping materials. The capping layer pattern 140 may be selectively formed on the conductive pattern 114. That is, in some embodiments, the capping layer pattern 140 can be positioned only on the barrier layer pattern 114a and the metal layer pattern 114b.

The additional insulation layer 142 is formed on the second insulation layer pattern 104a and the capping layer pattern 140 to fill a second gap between the second insulation layer pattern 104a and the conductive pattern 114. Thus, the first air gap 116 is closed by the additional insulation layer 142. The additional insulation layer 142 may include SiNx, SiCx, SiCxNy, etc. The additional insulation layer 142 may close the first air gap 116.

The wiring structure in FIG. 16 includes the capping layer 140 pattern on the conductive pattern 114, so that the capping layer pattern 140 may effectively prevent an electrical short of the conductive pattern 114 caused by electromigrations of metal atoms and/or metal ions in the conductive pattern 114.

Figure 17:
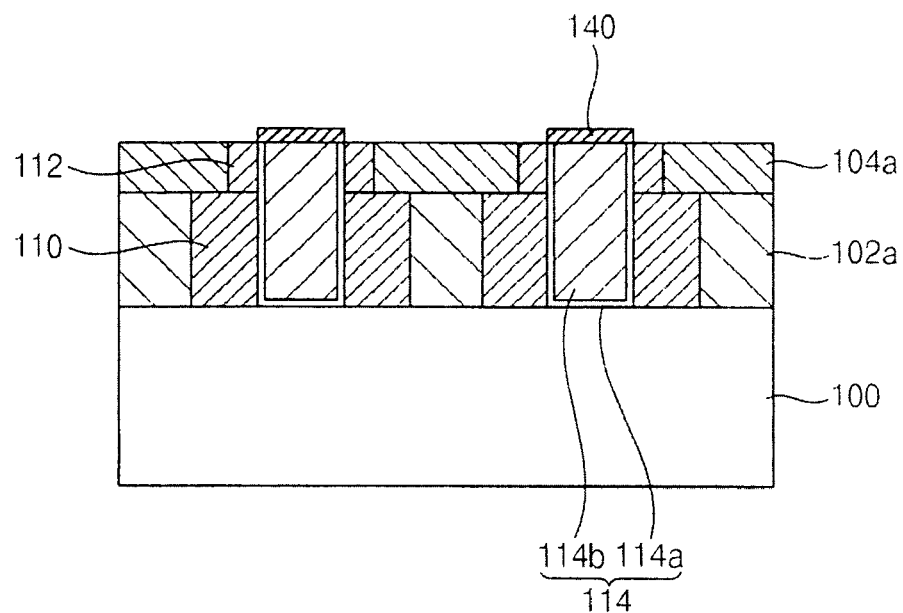
FIGS. 17 and 18 are cross-sectional views illustrating a method of forming a wiring structure in accordance with example embodiments.
Figure 18:
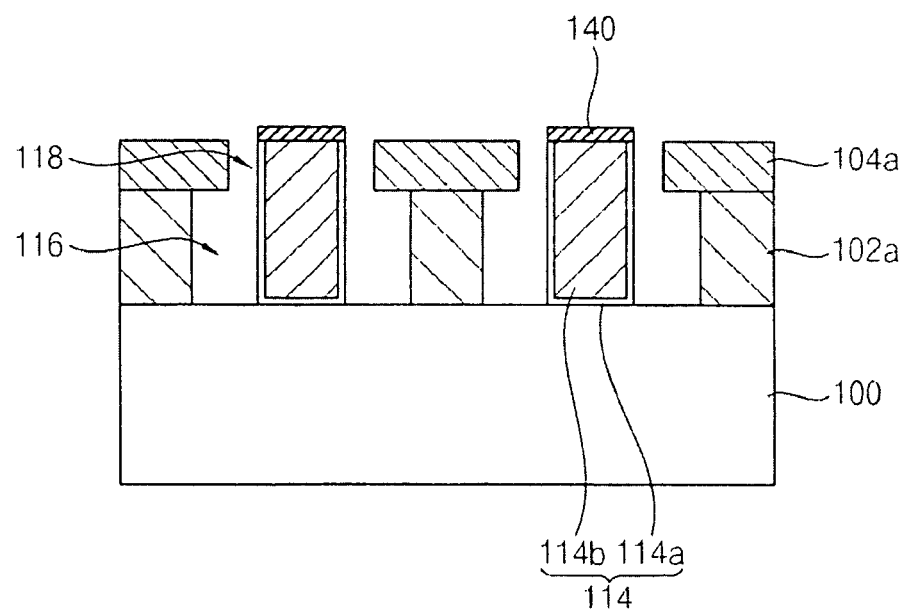

FIGS. 17 and 18 are cross-sectional views illustrating a method of forming the wiring structure in accordance with example embodiments. In the method illustrated in FIGS. 17 and 18, processes of forming a first insulation layer 102a, a second insulation layer 104a, a conductive pattern 114, a first pattern 110 and a second pattern 112 may be substantially the same as, or substantially similar to, the processes described with reference to FIGS. 3 to 6.

Referring to FIG. 17, a capping layer pattern 140 is formed on the conductive pattern 114 having a barrier layer pattern 114a and a metal layer pattern 114b. The capping layer pattern 140 may be formed by an electroless plating process. In the formation of the capping layer pattern 140, a water-based material may be selectively absorbed on a surface of the second insulation layer pattern 104 including a low-k material. The electroless plating process may be performed on a substrate 100 having the second insulation layer pattern 104a to form the capping layer pattern 140 on the conductive pattern 114. When the water-based material is absorbed on the surface of the second insulation layer pattern 104a, the second insulation layer pattern 104a may have a hydrophilic surface. In the electroless plating process, the capping layer pattern 140 may not be formed on the hydrophilic surface of the second insulation layer pattern 104a. Thus, the capping layer pattern 140 may be formed on the conductive pattern 114 only. After forming the capping layer pattern 140, the material absorbed on the surface of the second insulation layer pattern 104a may be removed by a cleaning process. The capping layer pattern 140 may include metal and/or metal compound.

Referring to FIG. 18, the second pattern layer 112 and the first pattern 110 are selectively removed from the second insulation layer pattern 104a and the first insulation layer pattern 102a. The first and the second patterns 110 and 112 may be removed by a wet etching process. For example, the first and the second patterns 110 and 112 may be etched using an etchant including a diluted HF solution. When the first and the second patterns 110 and 112 are removed, a first air gap 116 and a second air gap 118 are generated.

Referring now to FIG. 16, an additional insulation layer 142 is formed on the second insulation layer pattern 104a and the capping layer pattern 140 to fill the second air gap 118 between the conductive pattern 114 and the second insulation layer pattern 104a. To fill the second air gap 118 having a narrow width with the additional insulation layer 142, the additional insulation layer 142 may be formed by an ALD process. The additional insulation layer 142 may close the first air gap 116 between the first insulation layer pattern 102a and the conductive pattern 114.

Hereinafter, a method of forming a wiring structure in accordance with other example embodiments will be described.

Processes substantially the same as or substantially similar to the processes according to FIGS. 3 to 6 may be performed to form the resultant structure having a construction substantially the same as or substantially similar to that illustrated in FIG. 6. Then, a capping layer pattern may be formed on a conductive pattern. Here, the capping layer pattern may be formed by a process substantially the same as or substantially similar to the process described with reference to FIG. 17.

According to example embodiments, a wiring structure may have a low resistance and as improved structural stability while reducing a parasitic capacitance thereof. Therefore, the wiring structure may serve as various wirings in a semiconductor device requiring a high integration degree. When the wiring structure is used for wiring in a semiconductor memory device, the semiconductor device may ensure a considerably reduced RC delay time because the wiring structure has minimal parasitic capacitance and a low resistance.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A wiring structure comprising:
   a conductive pattern on a substrate;
   a first insulation layer pattern between adjacent conductive patterns and separated from the conductive pattern by a first distance to provide a first air gap between the conductive pattern and the first insulation layer pattern;
   a second insulation layer pattern on the first insulation layer pattern and separated from the conductive pattern by a second distance smaller than the first distance to provide a second air gap between the conductive pattern and the second insulation layer pattern;
   a third insulation layer on the conductive pattern and the second insulation layer pattern, the third insulation layer having an opening partially exposing the conductive pattern;
   an insulation pattern filling the second air gap between the conductive pattern and the second insulation layer pattern;
   a spacer on a sidewall of the opening; and
   an upper conductive pattern filling the opening.

2. The wiring structure of claim 1, wherein the first insulation layer pattern comprises a material that is more readily damaged by a plasma etch process than a material of the second insulation layer pattern.

3. The wiring structure of claim 1, wherein the first and the second insulation layer patterns include silicon hydroxyl carbon (SiCOH) having pores, and wherein the first insulation layer pattern has a pore concentration that is larger than that of the second insulation layer pattern.

4. The wiring structure of claim 1, wherein the conductive pattern comprises a barrier layer pattern and a metal layer pattern.

5. The wiring structure of claim 4, wherein the barrier layer pattern comprises at least one of metal and metal compound, and wherein the metal layer pattern includes at least one of copper (Cu), tungsten (W) and titanium (Ti).

6. The wiring structure of claim 1, further comprising a capping layer pattern selectively disposed on the conductive pattern.

7. The wiring structure of claim 1, wherein the insulation pattern closes the first air gap.

* * * * *